United States Patent
Wong

Patent Number: 5,976,228
Date of Patent: Nov. 2, 1999

[54] REDUCING AGENT FOR FORMING AN ACID RESISTANT BARRIER

[75] Inventor: Kwee C. Wong, Londonderry, N.H.

[73] Assignee: The Dexter Corporation, Industry, Calif.

[21] Appl. No.: 08/929,821

[22] Filed: Sep. 15, 1997

[51] Int. Cl.$^6$ .................................................. C23F 11/14
[52] U.S. Cl. .................................... 106/14.44; 106/14.11; 106/14.15; 106/287.23; 106/287.24; 106/287.25; 106/287.26
[58] Field of Search .............................. 106/14.44, 14.11, 106/14.15, 287.23, 287.24, 287.25, 287.26

[56] References Cited

U.S. PATENT DOCUMENTS

| | | | |
|---|---|---|---|
| 2,364,993 | 12/1944 | Meyer | 148/6 |
| 2,460,896 | 2/1949 | Meyer | 148/6.14 |
| 2,460,898 | 2/1949 | Meyer | 148/6.14 |
| 2,481,854 | 9/1949 | MacMahon | 148/6.14 |
| 4,409,037 | 10/1983 | Landau | 148/6.14 |
| 4,642,161 | 2/1987 | Akahoshi et al. | 156/630 |
| 4,902,551 | 2/1990 | Nakaso et al. | 428/137 |
| 4,997,516 | 3/1991 | Adler | 156/630 |
| 4,997,722 | 3/1991 | Adler | 428/596 |
| 5,472,563 | 12/1995 | Kogawa et al. | 427/305 |

*Primary Examiner*—Anthony Green
*Attorney, Agent, or Firm*—Fish & Richardson P.C., P.A.

[57] ABSTRACT

A composition that enhances the acid resistance of copper oxide. The composition includes a solution of an alkali metal borohydride and a quaternary ammonium ion in amounts selected such that when the composition is applied to copper oxide, the composition enhances the acid resistance of the copper oxide. The preferred alkali metal borohydride is sodium borohydride or potassium borohydride, and the preferred quaternary ammonium ion has the formula

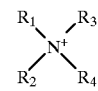

wherein each R1, R2, R3, R4 independently comprises a lower alkyl, hydroxylalkyl or carboxyalkyl group.

12 Claims, No Drawings

REDUCING AGENT FOR FORMING AN ACID RESISTANT BARRIER

BACKGROUND OF THE INVENTION

Manufacturers of printed circuit boards continuously seek ways to prevent corrosion of the copper used in printed circuit boards. This task is made more difficult by the fact that copper is purposely oxidized during the manufacturing process to increase the bonding strength between the copper and the base polymeric material of the printed circuit board. Oxidized copper is more readily corroded by acid than elemental copper. Therefore, the manufacturing process increases the possibility of corrosion. Although the majority of these copper oxide surfaces are covered with resin and thus protected from contact with acid, some exposed copper oxide surfaces remain. For example, exposed copper oxide surfaces are typically found at the edges of the printed circuit board or the through-holes used to interconnect the layers in multi-layer boards.

SUMMARY OF THE INVENTION

The present invention provides a composition that, when applied to copper oxide, enhances the acid resistance of copper oxide. The composition includes a solution of an alkali metal borohydride and a quaternary ammonium ion in amounts selected such that when the composition is applied to copper oxide, the composition enhances the acid resistance of the copper oxide. In preferred embodiments, the composition includes a stabilizing agent, e.g., an alkali metal hydroxide.

The alkali metal borohydride of the composition is preferably sodium borohydride or potassium borohydride. Preferably the quaternary ammonium ion has the formula

wherein each R1, R2, R3, R4 independently comprises a lower alkyl, hydroxylalkyl or carboxyalkyl group. The R1, R2, R3 and R4 can be independently substituted. The quaternary ion can be a dihydroxyethyldimethylammonium, choline, tetramethylammonium, betaine ion, and combinations thereof and is introduced into the composition as the salt of the halides, citrate or hydroxide.

In preferred embodiments, the amount of alkali metal borohydride in the composition is between about 0.01 and about 50% by weight (more preferably between about 0.1 to about 0.4% by weight), and the amount of the quaternary ammonium ion present in the composition is between about 0.01 to about 50% by weight (more preferably between about 0.1% to about 0.4% by weight).

In a second aspect, the invention features a method for forming an acid resistant copper oxide barrier including preparing a solution having an alkali metal borohydride and a quaternary ammonium ion in amounts selected such that when the composition is applied to copper oxide, the composition enhances the acid resistance of the copper oxide, and contacting the copper oxide surface with the solution for a period sufficient to enhance the acid resistance of the copper oxide.

In preferred embodiments, the composition is heated prior to contacting the composition to the copper oxide surface. Preferably the solution is heated to a temperature of at least about 110° F., more preferably between about 110° F. and about 120° F. The heated composition can be contacted with the copper oxide surface for at least about three minutes.

The present invention provides an acid resistant barrier without grossly altering the topography or the functionality of the original oxide coating. In addition, the composition will not alter the integrity of the oxide coating or its ability to bond with the resin during the printed circuit board manufacturing process.

Other features and advantages of the invention will be apparent from the following description of the preferred embodiments thereof, and from the claims.

DESCRIPTION OF THE PREFERRED EMBODIMENTS

The composition enhances the acid resistance of copper oxide, i.e., increases the length of time during which the copper oxide is able to withstand contact with an acid without being altered by the acid. The composition does this by forming an acid resistant barrier on the copper oxide. The composition includes a solution of an alkali metal borohydride and a quaternary ammonium ion. The composition may also include an alkali metal hydroxide.

Suitable alkali metal borohydrides include sodium borohydride and potassium borohydride. The alkali metal borohydride is preferably present in the composition in an amount between about 0.01 to about 50% by weight, more preferably about 0.1 to 0.4% by weight.

The quaternary ammonium ion bonds with the copper oxide to provide the acid resistant barrier. The quaternary ammonium ion has the formula

wherein each R1, R2, R3, R4 independently comprises a lower alkyl, hydroxylalkyl or carboxyalkyl group. The lower alkyl groups can include, e.g., methyl, ethyl, propyl, butyl, pentyl groups, and the like. The hydroxyalkyl group can include, e.g., methanol, ethanol, propanol, butanol, pentanol, and the like. The carboxalkyl group can include, e.g., carboxymethyl, carboxyethyl, carboxypropyl, carboxybutyl, carboxypentyl groups, and the like. The R1, R2, R3 and R4 can be independently substituted. Examples of suitable quaternary ammonium ions include dihydroxyethyldimethylammonium, choline, tetramethylammonium, betaine ion, and combinations thereof and can be introduced as the salt of the halides, citrate or hydroxide. The quaternary ammonium ion is preferably present in the composition in an amount between about 0.01 to about 50% by weight, more preferably between about 0.1 to about 0.4% by weight.

The alkali metal hydroxide stabilizes the alkali metal borohydride in aqueous solutions. Suitable alkali metal hydroxides include sodium hydroxide and potassium hydroxide. The alkali metal hydroxide may be present in the composition in an amount of between about 5 and about 40% by weight.

Preferred embodiments of the invention will now be described by way of the following examples.

EXAMPLES

Acid Test Solution

A 1:1 HCl test solution was prepared by diluting 1 part reagent grade hydrochloric acid with 1 part deionized water.

Example 1

100 grams of a composition that enhances the acid resistant property of copper oxide having the following composition was prepared (all amounts in grams):

| | |
|---|---|
| Sodium hydroxide | 5.0 |
| Sodium borohydride | 8.0 |
| Dihydroxyethyldimethylammonium hydroxide | 8.0 |
| Deionized water | Balance |

The solution was diluted to a 10% by volume solution with deionized water and heated to between 110° F. and 120° F. in a water-bath to maintain the temperature range. A copper oxide coupon was immersed in the solution for four minutes. The physical evidence of chemical reduction was observed in the form of effervescence. The effervescence was slow initially but gradually became vigorous. The effervescence soon subsided to a few bubbles, which signified the end of the reaction. The coupon was then rinsed with water and air-dried with a hot-air blower. The color of the coupon was lighter compared to the original darker color of the oxide coating. A drop of the 1:1 HCL test solution was applied to the coupon. The coupon demonstrated an acid-resistant property for approximately five minutes at which point a red spot of the copper substrate appeared.

Comparative Example 1

The procedure of Example 1 was followed except that the dihydroxyethyldimethylammonium hydroxide was omitted from the composition. When the copper oxide coupon was placed in the composition the effervescence did not slow near the processing time of four minutes and chemical reduction continued unhindered. When the drop of 1:1 hydrochloric acid was applied to the copper oxide surface, there was no acid resistance. Rather, corrosion occurred immediately as demonstrated by the appearance of a red spot on the copper substrate.

Comparative Example 2

The procedure of Example 1 was followed except that dimethylamine borane was substituted for dihydroxyethyldimethylammonium hydroxide. The acid resistant property of the reduced copper coupon persisted for only 1.5 minutes when tested with the 1:1 HCl solution.

Example 2

The procedure of Example 1 was followed except that 8.0 grams of choline chloride was used instead of DHDMAH. The results were similar to those observed in the case of Example 1.

Example 3

The procedure of Example 1 was followed except that 8.0 grams of tetramethylammonium chloride was used instead of DHDMAH. The results were similar to those observed in the case of Example 1.

Example 4

100 grams of a composition that enhances the acid resistant property of copper oxide having the following composition was prepared (all amounts in grams):

| | |
|---|---|
| Sodium hydroxide | 12.0 |
| Sodium borohydride | 8.0 |
| Betaine hydrochloride | 8.0 |
| Deionized water | Balance |

The solution was then diluted to a 10% by volume solution with deionized water and heated to between 110° F. and 120° F. The solution was heated in a water-bath to maintain the temperature range. A copper oxide coupon was immersed in the solution for four minutes. The physical evidence of chemical reduction was observed in the form of effervescence. The effervescence was slow initially but gradually became vigorous. The effervescence eventually subsided to a few bubbles which signified the end of the reaction. The coupon was then rinsed with water and air-dried with a hot-air blower. The color of the coupon was lighter compared to the original darker color oxide coating. A drop of a 1:1 HCl test solution was placed on the coupon where the acid-resistant property persisted for about five minutes at which point a red spot of the copper substrate appeared.

Example 5

All of the compositions from Examples 1–4 were diluted to 5% by volume with deionized water. The procedure of Example 1 was followed. The results were similar to those observed in the case of Example 1.

Other embodiments are within the claims.

What is claimed is:

1. A composition comprising a solution of an alkali metal borohydride and a quaternary ammonium ion in amounts selected such that when said composition is applied to copper oxide, said composition enhances the acid resistance of the copper oxide.

2. The composition of claim 1 wherein said alkali metal borohydride comprises sodium borohydride or potassium borohydride.

3. The composition of claim 1 wherein said quaternary ammonium ion has the formula

wherein each R1, R2, R3, R4 independently comprises a lower alkyl, hydroxylalkyl or carboxyalkyl group.

4. The composition of claim 1 wherein said quaternary ammonium ion comprises a dihydroxyethyldimethylammonium, choline, tetramethylammonium, betaine ion, or a combination thereof.

5. The composition of claim 1 wherein said quaternary ammonium ion comprises a dihydroxyethyldimethylammonium ion.

6. The composition of claim 1 wherein said alkali metal borohydride comprises sodium borohydride and said quaternary ammonium ion comprises dihyroxyethyldimethylammonium ion.

7. The composition of claim 1 comprising between about 0.01 to 50% by weight of said alkali metal borohydride and about 0.01 to 50% by weight of said quaternary ammonium ion.

8. The composition of claim 1, wherein said solution is an aqueous solution.

9. The composition of claim 1, further comprising a stabilizing agent in an amount effective to stabilize said composition.

10. The composition of claim 1 further comprising an alkali metal hydroxide in an amount selected to stabilize the composition.

11. The composition of claim 1, further comprising a stabilizing agent capable of stabilizing said alkali metal borohydride.

12. A composition comprising an aqueous solution of a sodium borohydride, a quaternary ammonium ion, and an alkali metal hydroxide in amounts selected such that when said composition is applied to copper oxide, said composition enhances the acid resistance of the copper oxide.

* * * * *